United States Patent [19]

Rogers et al.

[11] Patent Number: 5,454,928
[45] Date of Patent: Oct. 3, 1995

[54] PROCESS FOR FORMING SOLID CONDUCTIVE VIAS IN SUBSTRATES

[75] Inventors: Michael R. Rogers, Santa Clara County, Calif.; Theodore E. Washburn, South Barrington, Ill.; Michael A. Novice, Santa Clara County, Calif.; Ronald S. Besser, San Mateo County, Calif.; Brian S. White, Alameda County, Calif.

[73] Assignee: Watkins Johnson Company, Palo Alto, Calif.

[21] Appl. No.: 181,665

[22] Filed: Jan. 14, 1994

[51] Int. Cl.⁶ .................. H05K 3/42; C25D 5/02
[52] U.S. Cl. .......... 205/125; 205/162; 205/186; 205/222; 205/224; 427/97
[58] Field of Search .................. 205/123, 125, 205/126, 162, 186, 222, 224; 427/96, 97; C25D 5/02

[56] References Cited

U.S. PATENT DOCUMENTS

| | | | |
|---|---|---|---|
| 3,385,773 | 5/1968 | Frantzen | 205/125 |
| 4,131,516 | 12/1978 | Bakos et al. | 205/125 X |
| 4,368,106 | 1/1983 | Anthony | 205/125 X |
| 4,808,273 | 2/1989 | Hua et al. | 205/125 X |
| 5,055,425 | 10/1991 | Leibovitz et al. | 437/195 |
| 5,162,260 | 11/1992 | Leibovitz et al. | 437/195 |

OTHER PUBLICATIONS

Frederick A. Lowenheim, *Electroplating*, McGraw–Hill Book Co., New York, 1978, p. 59.

Primary Examiner—John Niebling
Assistant Examiner—William T. Leader
Attorney, Agent, or Firm—Flehr, Hohbach, Test, Albritton & Herbert

[57] ABSTRACT

A method of forming solid metal vias extending between the top and bottom surfaces of a substrate with the ends of the vias being substantially coplanar with the top and bottom surfaces. The method includes the steps of forming holes through the substrate, plating the interior of the holes with excess metal to fill the holes and extend beyond the ends of the holes, heating the substrate to cause the metal to melt and consolidate to form solid vias with domed ends, and lapping the top and bottom surfaces of the substrate to remove the domes. Conductive layers may then be formed over the vias. These layers may have windows over a portion of each via to provide an escape route for expanding fluids during further processing of the substrate.

7 Claims, 3 Drawing Sheets

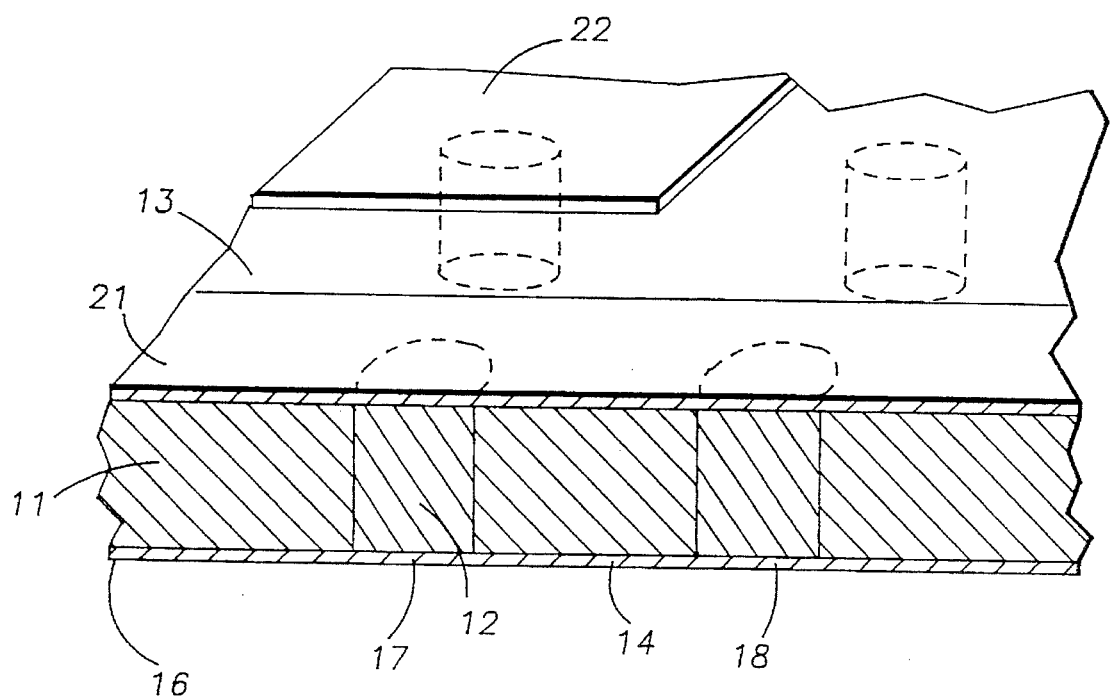
FIG.—1

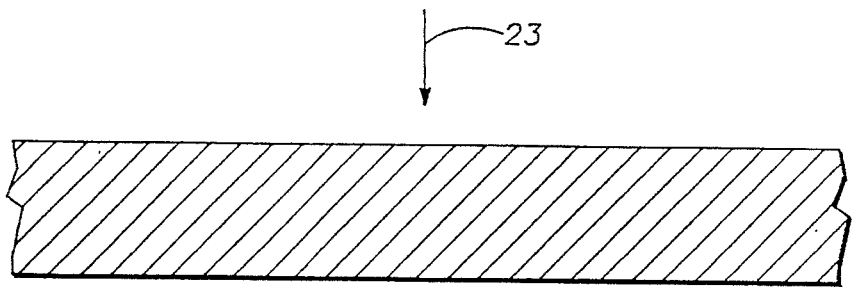
FIG.—2A
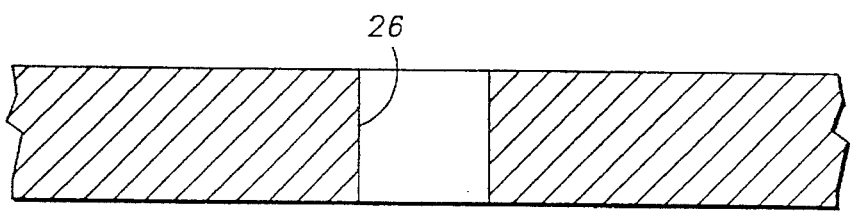
FIG.—2B
FIG.—2C
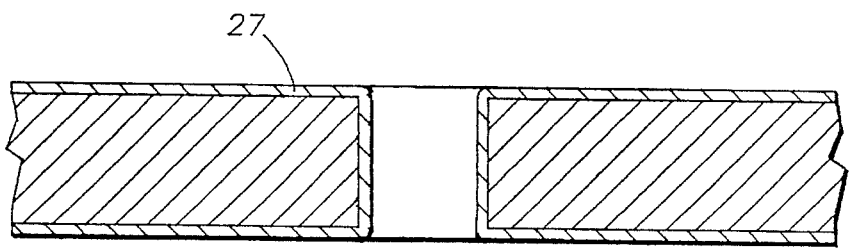
FIG.—2D
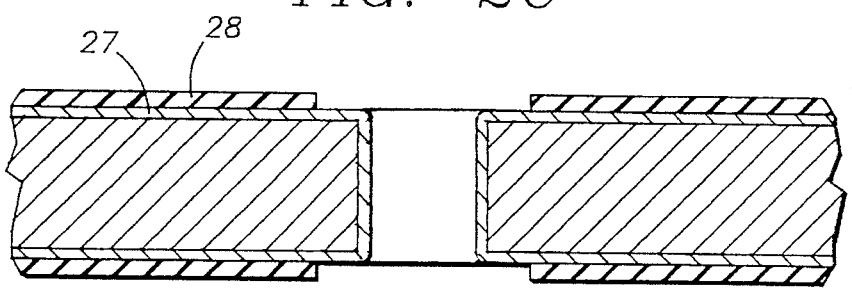
FIG.—2E
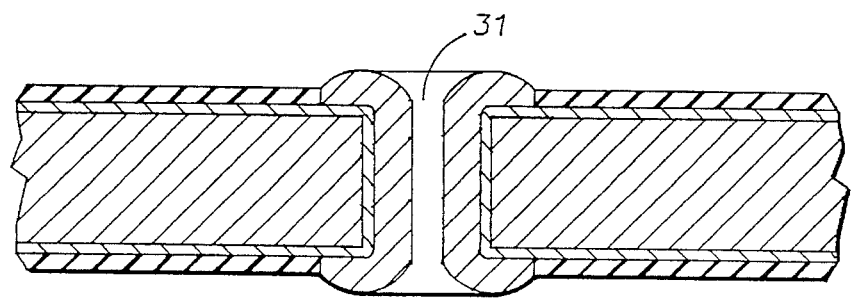

PROCESS FOR FORMING SOLID CONDUCTIVE VIAS IN SUBSTRATES

BRIEF DESCRIPTION OF THE INVENTION

This invention relates generally to a process for forming solid vias or electrical connections from the top plane of a substrate to the bottom plane of the substrate.

BACKGROUND OF THE INVENTION

A through-hole or "via" can be defined as a built-in, electrical connection from the top plane of a circuit substrate to the bottom plane of the same substrate. In order to be useful to microwave circuit designers, a via must have certain desirable characteristics: 1) the ability to establish ground at a point on the top plane of the substrate with a ground plane at the underside with low values of series resistance and inductance along the vias (vias have been used on ceramic substrates for many years because the top-side grounding achieved is not possible using wire bonding); 2) in order to conduct heat, it must also have a sufficiently low thermal impedance (this would be of importance when a circuit component, for example a power GaAs FET, is mounted directly atop the via); 3) for circuits which are mounted using eutectic die-attach methods, the via must not provide a pathway for the flow of molten material to the top of the substrate during assembly.

Prior art vias have included through-holes with gold walls formed by sputtering or other vacuum deposition. These have provided desired low impedance contact between the top and the bottom of the substrate. However, one of the major problems encountered was the effect on the circuit assembly when it was brazed to a carrier. When the braze material (typically gold-germanium) entered the via, the gold metalization tended to dissolve into the braze, resulting in highly resistive, or even open vias. One solution to this problem has been to manually apply magnesium hydroxide into the holes before assembly to prevent flow of the braze material. This unwieldy and unreliable procedure caused use of vias to fall out of favor.

Another method used to deposit gold on the interior of the via was electroplating. This method gave thicker layers with more resistance to the gold leaching effect. However, blisters formed in the plated layer within and around the via. To solve this problem, deposition of a very thick layer of gold within the hole was used to control blistering. At the same time, braze flow was limited by the incorporation of an oxidized metal layer on the gold which could not be wetted by the molten braze. The oxide layer was formed by electrodeposition or sputter deposition followed by heating in air.

The development of high throughput assembly techniques for assembly of microwave circuits involved heating the circuit to temperatures as high as 425° C. during brazing. This resulted in the breakdown of the oxide brazing barrier layer, and once again braze flow was a problem.

The ultimate solution to the braze flow problems, as well as blistering in holes, is the complete filling of the via with a solid gold plug.

OBJECTS AND SUMMARY OF THE INVENTION

It is an object of this invention to provide a process for forming solid vias between the top and bottom surfaces of a ceramic substrate.

It is another object to provide a process for forming solid vias whose ends are planar with the top and bottom surfaces of the substrate.

The foregoing and other objects of the invention are achieved by forming holes in a substrate at the desired locations for solid vias, metalizing at least the entire surface of the holes to form a seed layer for plating, plating the interior of the holes with metal until they are filled with metal which domes above the top and bottom of the substrate, melting and resolidifying the deposited metal, and lapping the substrate to remove the domes and form a solid via with its top and bottom ends coplanar with the top and bottom of the substrate.

BRIEF DESCRIPTION OF THE DRAWINGS

The foregoing and other objects of the invention will be more clearly understood from the following detailed description when read in conjunction with the accompanying drawings of which:

FIG. 1 is a perspective view partly in section showing vias formed in accordance with the invention;

FIGS. 2A–2H show the steps in the process for forming vias in accordance with the invention.

DESCRIPTION OF PREFERRED EMBODIMENTS

Figure 2F:
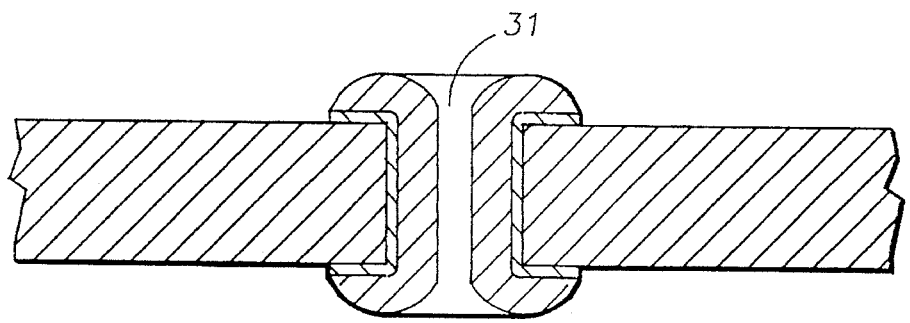

FIG. 1 shows a substrate 11 with solid vias 12 in accordance with the invention. The substrate 11 may, for example comprise a ceramic substrate. The solid vias 12 extend between the top plane surface 13 of the substrate and the bottom plane surface 14. The ends 16, 17 of the solid vias are preferably coplanar with the upper and lower surfaces of the substrate. Slight disruptions to the planarity do not necessarily render the via defective. In the above example, a ground plane 18 is formed on the bottom surface of the substrate and makes electrical connection with the bottom surface 17 of the solid via. The upper surface is schematically shown with a circuit trace 21 making contacts with two via holes and another circuit trace 22 making contact with a single via. It is to be understood however, that the configuration of the circuit elements on the top surface and on the bottom surface may be varied to accommodate circuit elements which are to be interconnected between each other and between the top and bottom surfaces.

Figure 2G:
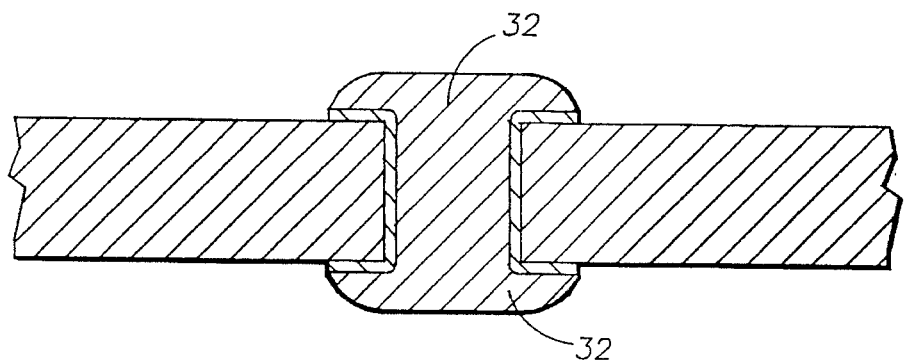

Referring now to FIG. 2, the steps in forming a solid via are illustrated. FIG. 2A shows a laser beam 23 impinging on the substrate 11 to drill holes through the substrate in a desired hole pattern. Before the desired drilling step, the substrate is coated with an organic water soluble polymer to protect the surface from debris which is generated during the laser drilling step. A carbon dioxide (10.6 nm) laser operated at 30 watts and focused to a 50 μm spot may be used to perforate the locations where a via is to be centered. A circular pattern is then drilled (i.e., 0.013"), FIG. 2B, around the perforation resulting in holes 26 of desired diameter. The polymer coating is then removed along with the debris generated by the laser. More stubborn residues of solidified alumina remaining at the perimeter at each hole may be scraped away before the next step. It is to be understood that holes or openings formed in the substrate by other means, e.g. ultrasonic drilling, can also be filled using this process.

The substrate is then metalized by sputtering a seed layer 27 such as titanium, tungsten and gold, FIG. 2C. Sputtering is performed from both sides in order to achieve continuous metalization 27 inside the hole 26. The top and bottom surfaces are masked to leave only the holes and their upper and lower periphery exposed, FIG. 2D. Dry-film or liquid photoresist materials may be used for this masking. When using dry-film resists, a pattern is formed by applying an adhesive tape to the surface and then removing the tape. When the tape is removed it takes with it a small disk of the resist at the location of each hole. Liquid resist may be applied by spray coating.

Figure 2H:
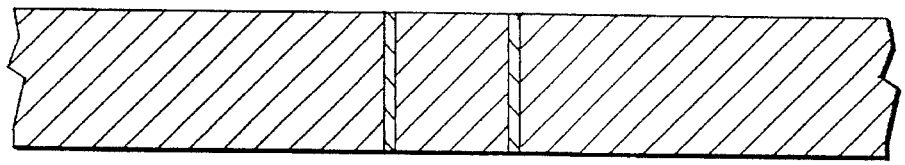

The next step, FIG. 2E, is to plate gold into the holes. We found, however, that vias filled by gold plating 29 had cylindrical voids or pores 31 at their centers. We soon discovered that this was a consequence of electrodeposition in a decreasing volume. As the plated layer thickness increases, it becomes more difficult to transport gold species into the interior cavity, resulting in the void. This nonuniform gold-plating, FIG. 2E, was corrected with the development of further steps 2F, 2G. The resist film and metal layer are removed by etching, FIG. 2F. The gold is reconfigured by raising the temperature above the melting point of the gold. The gold forms a solid with dome-shaped ends 32. The next step is to remove the gold domes; this can be achieved by lapping the surfaces to leave a substrate such as shown in FIG. 2H.

Following this step, fabrication of the conducting leads and resistors and application of active devices can proceed as if the ceramic substrate were a uniform substrate.

Figure 3:
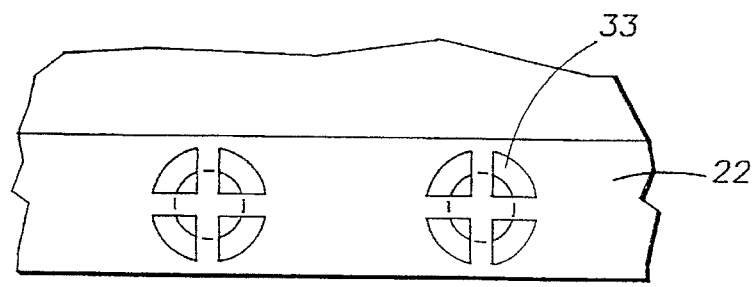
FIG. 3 is a plan view showing conductors formed to prevent blistering at via sites.

When continuous plated pads or layers are formed above a via and heated, blisters may form at the interface between the layers on the via near their perimeter. A possible cause of this behavior is the nature of the perimeter boundary. During the reshaping process the substrate and plugs are subjected to temperature in excess of 1000° such that there is no thermal stress between the gold and ceramic. Upon cooling to room temperature, however, the plug and substrate contract at different rates due to their differing thermal expansion coefficients. This gives rise to residual stress which can be relieved by the formation of a small gap within the via ceramic interface. This gap acts as a source of trapped air, plating liquid, or perhaps other fluids. Heating during subsequent processing may result in blistering. However, circuit trace or layer design 22 at the via pad, as illustrated in FIG. 3, has resulted in the complete elimination of the blistering. The layer is formed so that it has cutouts 33 over the via plug which provide an escape route for expanding fluids such as air or plating liquids. The open design also allows for relief of stresses between the conductor layer 22 and the underlying via.

Thus, there has been disclosed a novel process for forming solid conductive vias in a ceramic substrate and forming conducting layers on the surface of the substrate.

What is claimed:

1. The method of forming solid vias which extend between the top and bottom plane surfaces of a ceramic substrate, comprising the steps of:

forming holes which extend through the substrate at desired locations for said solid vias, metalizing at least the entire surface of the holes to form a seed layer for plating;

plating the interior of the holes with excess metal to fill the holes and extend beyond the ends of the holes;

heating the substrate to cause the metal to melt and consolidate to form homogeneous solid vias with domed ends; and lapping the top and bottom surfaces of the substrate to remove the domes and leave solid metal vias with top and bottom ends coplanar with the top and bottom surfaces of the substrate.

2. The method of forming solid vias in a substrate as in claim 1 wherein the step of metalizing at least the entire surface of the holes comprises:

sputter depositing a metal layer on the top and bottom surfaces of the substrate and the surface of the hole;

applying a resist mask to the top and bottom surfaces; and removing resist material at the ends of the holes to expose the metal layer in the holes and adjacent to the ends thereof for plating.

3. The method of claim 2 including the step of removing the resist layer and metal layer remaining exposed after the plating step.

4. The method of forming a circuit including a substrate having solid gold vias which extend between the top and bottom plane surfaces of the substrate, comprising the steps of:

forming holes which extend through the substrate at desired locations for said solid vias, metalizing at least the entire surface of the holes to form a seed layer for plating;

plating the interior of the holes with excess gold to substantially fill the holes and provide gold extending above the top and bottom surfaces of the substrate;

heating the substrate to cause the gold to melt and consolidate to form solid vias with domed ends; and lapping the top and bottom surfaces of the substrate to remove the gold domes and leave solid gold vias with top and bottom ends coplanar with the top and bottom surfaces of the substrate.

5. The method of forming solid vias in a substrate as in claim 4 wherein the step of metalizing at least the entire surface of the holes comprises:

sputter depositing a metal layer on the top and bottom surfaces of the substrate and the surface of the hole;

applying a dry film resist mask to the top and bottom surfaces; and removing resist mask material at the ends of the holes to expose the metal layer in the holes and adjacent to the ends thereof for plating.

6. The method of claim 5 including the step of removing the resist layer and metal layer remaining exposed after the plating step.

7. The method of claim 4 including the additional step of forming conductive layers over and in contact with the upper surface of selected vias, said layers having windows over a portion of the via substrate interface to provide an escape route for expanding fluids during further processing of the substrate.

* * * * *